United States Patent
Finn

(10) Patent No.: US 12,231,119 B2
(45) Date of Patent: *Feb. 18, 2025

(54) LOWER VOLTAGE SWITCHING OF CURRENT MODE LOGIC CIRCUITS

(71) Applicant: TEXAS INSTRUMENTS INCORPORATED, Dallas, TX (US)

(72) Inventor: Steven Ernest Finn, Chamblee, GA (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

This patent is subject to a terminal disclaimer.

(21) Appl. No.: 16/834,316

(22) Filed: Mar. 30, 2020

(65) Prior Publication Data

US 2020/0228119 A1 Jul. 16, 2020

Related U.S. Application Data

(63) Continuation of application No. 15/993,725, filed on May 31, 2018, now Pat. No. 10,644,699.

(51) Int. Cl.
*H03K 19/00* (2006.01)
*H03K 19/0175* (2006.01)
*H03K 19/0944* (2006.01)

(52) U.S. Cl.
CPC ....... *H03K 19/0016* (2013.01); *H03K 19/001* (2013.01); *H03K 19/0013* (2013.01);
(Continued)

(58) Field of Classification Search
CPC ............ H03K 19/0016; H03K 19/001; H03K 19/09448; H03K 19/017554;
(Continued)

(56) References Cited

U.S. PATENT DOCUMENTS

| 4,988,898 A | 1/1991 | Jansson |
| 6,169,421 B1 | 1/2001 | Bryan et al. |

(Continued)

FOREIGN PATENT DOCUMENTS

| RU | 23943 | 7/2001 |
| RU | 2460206 | 8/2012 |

OTHER PUBLICATIONS

International Search Report in corresponding PCT Application No. PCT/US2019/034176, mailed Aug. 29, 2019 (2 pages).
(Continued)

*Primary Examiner* — Patrick C Chen
(74) *Attorney, Agent, or Firm* — John R. Pessetto; Frank D. Cimino

(57) ABSTRACT

A circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor and a second transistor comprising a second control input and third and fourth current terminals, the third current terminal coupled to the first resistor and to the first capacitor.

7 Claims, 2 Drawing Sheets

(52) U.S. Cl.
CPC ............... *H03K 19/017554* (2013.01); *H03K 19/09448* (2013.01)

(58) Field of Classification Search
CPC . H03K 19/0013; H03F 1/0205; H03F 1/0211; H03F 3/4508–45174
See application file for complete search history.

(56) References Cited

U.S. PATENT DOCUMENTS

| | | | |
|---|---|---|---|
| 7,982,542 B1* | 7/2011 | Sicard | H03F 3/4508 330/257 |
| 2003/0132797 A1 | 7/2003 | Mohieldin et al. | |
| 2007/0024377 A1* | 2/2007 | Wang | H03F 1/42 330/305 |
| 2007/0120600 A1 | 5/2007 | Byun et al. | |
| 2011/0199130 A1* | 8/2011 | Hu | H03K 19/017518 327/109 |
| 2012/0229174 A1 | 9/2012 | Shiah et al. | |
| 2014/0062609 A1* | 3/2014 | Lee | H03B 5/364 331/116 FE |
| 2016/0072448 A1* | 3/2016 | Carrara | H03F 1/083 330/260 |

OTHER PUBLICATIONS

Usama, Muhammad and Tad Kwasniewski, "New CML Latch Structure for High Speed Prescaler Design." CCECE 2004-CCGEI 2004, Niagra Falls, May 2004.

* cited by examiner

LOWER VOLTAGE SWITCHING OF CURRENT MODE LOGIC CIRCUITS

CROSS REFERENCE TO RELATED APPLICATION(S)

This continuation application claims priority to U.S. patent application Ser. No. 15/993,725, filed May 31, 2018, which application is incorporated herein by reference in its entirety.

BACKGROUND

Many circuit applications are more valuable as the speed of the circuits increases. Examples of such circuits include latches, flip-flops, multiplexers, and combinatorial logic. Some approaches to increasing speed unfortunately also involve increased power consumption.

SUMMARY

In one example, a circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor and a second transistor comprising a second control input and third and fourth current terminals, the third current terminal coupled to the first resistor and to the first capacitor.

In another example, a circuit includes a first transistor comprising a first control input and first and second current terminals, the first control input coupled to receive a first input control signal, and the first current terminal coupled to a first power supply node. The circuit also includes a first resistor coupled to the first control input of the first transistor, a first capacitor coupled between the second current terminal of the first transistor and the first resistor, and a second transistor comprising a second control input and third and fourth current terminals, the third current terminal coupled to the first resistor and to the first capacitor. A third transistor also is included which comprises a third control input and seventh and eighth current terminals, the third control input coupled to receive a second input control signal, the second input control signal being reciprocal to the first input control signal. The circuit further includes a second resistor coupled to the third control input, a second capacitor coupled between the sixth current terminal and the second resistor, and a fourth transistor comprising a fourth control input and seventh and eighth current terminals, the seventh current terminal coupled to the second resistor and to the second capacitor.

In yet another example, a circuit includes a first transistor comprising a first control input and first and second current terminals, the first control input coupled to receive a time-varying first input control signal, a first resistor coupled to the first control input of the first transistor and a first high pass filter coupled to the second current terminal and to the first resistor at a first output node, the first high pass filter having a first cut-off frequency. The voltage on the second current terminal of the first transmitter is provided through the first high pass filter to the first output node at frequencies of the time-varying first input control signal above the first cut-off frequency. At frequencies of the time-varying first input control signal below the first cut-off frequency, the voltage on the first output node is a voltage drop across the first resistor less than the time-varying first input control signal.

BRIEF DESCRIPTION OF THE DRAWINGS

For a detailed description of various examples, reference will now be made to the accompanying drawings in which.

DETAILED DESCRIPTION

The disclosed examples are directed to a circuit for driving current mode logic (CML) circuits. The disclosed drive circuit is such that the CML logic can be operated from a lower voltage power supply than would have otherwise been used. In some prior CML implementations, the circuit that generates the control signals for the CML-based functional circuit includes a stacked arrangement of bipolar junction transistors (e.g., n-type bipolar junction transistors). As a result of the stacked bipolar junction transistors (BJTs) and based on other headroom issues within the CML-based circuit, the power supply voltage is greater than or equal to a certain minimum value, which currently is around 2.5V. Part of the headroom issue driving the selection of a power supply voltage is the base-to-emitter voltage (Vbe) of a BJT. With the stacked BJT arrangement, at least 2*Vbe is needed for the power supply voltage, and more than that based on other headroom issues. A Vbe voltage is approximately 0.8V and thus 2*Vbe is approximately 1.6V. Including other headroom issues associated with CML circuits, the power supply voltage is generally at least 2.5V.

The disclosed circuit for producing the control signals to operate a CML functional circuit (e.g., a CML latch, a CML multiplexer, a CML flip-flop, etc.) does not use a stacked BJT arrangement and can produce a suitable voltage for the CML logic while using a lower supply voltage. In one example, the supply voltage is 1.5V.

Figure 1:
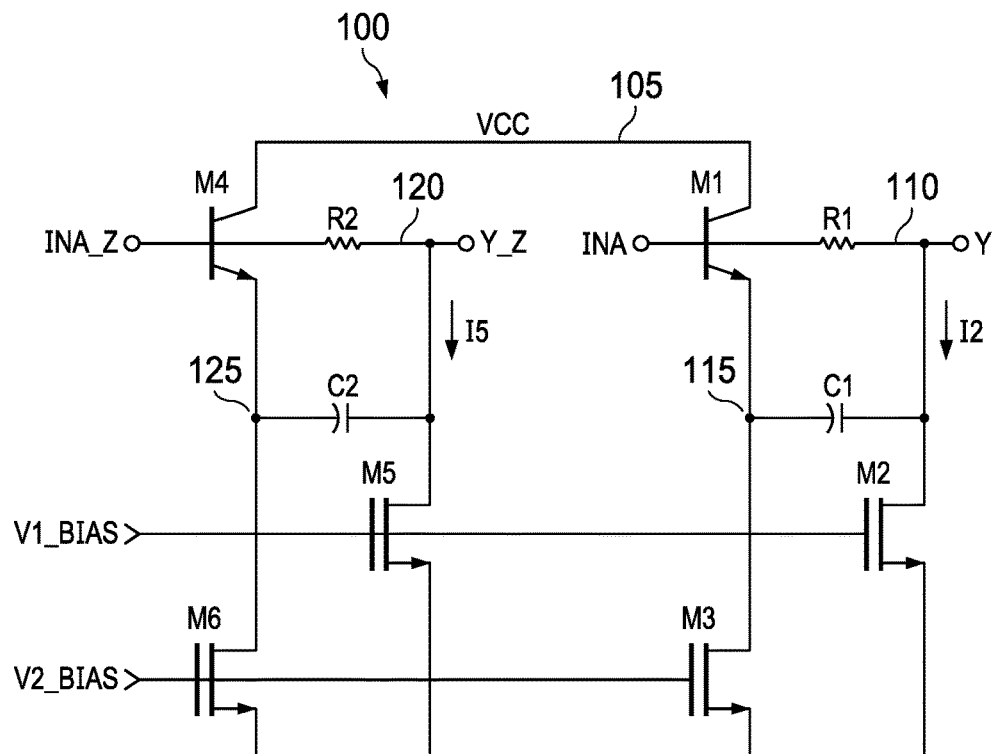
FIG. 1 illustrates a control signal drive circuit in accordance with an example.

FIG. 1 shows a control signal drive circuit 100 in accordance with an example. The control signal drive circuit 100 in this example receives input control signals INA and INA_Z and produces output signals Y and Y_Z that are level-shifted with respect to the INA and INA_Z. The input control signals INA and INA_Z are time-varying signals that are reciprocal to each other and that have a DC level. It is the DC level of the input control signals INA and INA_Z that is level-shifted by the control signal driver circuit 100 so that the output signals Y and Y_Z are time-varying with a shape and timing that is generally the same as the input control signals INA and INA_Z but at a different DC voltage level. The level shift of the input control signals ensures that the output signals Y and Y_Z are at voltages that are adequate to control the control inputs of transistors in a downstream CML functional circuit.

Each of the input control signals INA and INA_Z have a similar circuit to convert the input signal to a corresponding output signal. For example, the control signal drive circuit 100 includes transistors M1, M2, and M3, resistor R1, and capacitor C1 for input signal INA. The control signal drive circuit 100 includes transistors M4, M5, and M6, resistor R2, and capacitor C2 for input control signal INA_Z, In this example, M1 and M4 are n-type BJTs and M2, M3, M5 and M6 are n-type metal oxide semiconductor field effect transistors (NMOS). In other implementations, the transistors M1-M6 can be of other types. For example, M1 and M4 can be implemented as p-type BJTs and any of M2, M3, M5, and M6 can be implemented as p-type metal oxide semiconductor field effect transistors (PMOS) or as BJTs. Each transistor M1-M6 has a control input and a pair of current terminals. In the case of a BJT (e.g., M1 and M4), the control input is the base of the transistors and the current terminals are the transistor's collector and emitter. In the case of an NMOS or PMOS device, the control input is the transistor's gate and the current terminals are the transistor's source and drain.

Input signal INA is provided to the base of M1 and to one terminal of R1. The collector of M1 is connected to a power supply node 105 (e.g. VCC). The other terminal of R1 (node 110) represents the output signal Y. Capacitor C1 connects to the emitter of M1 and to the resistor R1 at node 110. The drain of M2 also connects to capacitor C1 and resistor R1 at node 110 as shown. The source of M2 is connected to a power supply node 107 (e.g., ground). The drain of M3 is connected to the emitter of M1 and to capacitor C1, and the source of M3 is connected to power supply node 107. The gate of M2 is biased by way of bias voltage V1_BIAS and the gate of M3 is biased by way of bias voltage V2_BIAS.

The architecture of the control signal drive circuit 100 with respect to input control signal INA_Z is similar to that described above regarding input control signal INA. Input signal INA_Z is provided to the base of M4 and to one terminal of R2. The collector of M4 is connected to the power supply node 105. The other terminal of R2 (node 120) represents the output signal Y_Z. Capacitor C2 connects to the emitter of M4 and to the resistor R2 at node 120. The drain of M5 also connects to capacitor C2 and resistor R2 at node 120 as shown. The source of M5 is connected to power supply node 107. The drain of M6 is connected to the emitter of M4 and to capacitor C1, and the source of M3 is connected to power supply node 107.

The gate of M5 is biased by way of bias voltage V1_BIAS and the gate of M6 is biased by way of bias voltage V2_BIAS. Transistors M2 and M5 are of equal size in some implementations and thus being biased by the same bias voltage V1_BIAS causes the current through M2 (designed as I2 in FIG. 1) to be approximately the same as the current through M5 (designated as I5). Similarly, transistors M3 and M6 are of equal size in some implementations and thus being biased by the same bias voltage V2_BIAS causes the drain current through M3 to be approximately the same as the drain current through M5.

Capacitor C1 is part of a high pass filter. The resistance of the downstream circuit as viewed from node 110, coupled with C1 forms the high pass filter. As noted above, INA is a time-varying signal with a DC component. The high pass filter permits the frequency components on the emitter of M1 above the filter's cut-off frequency to pass through C1 to the output signal Y at node 110. As M1 is controlled by time-varying input control signal INA, the voltage on node 115 also is time-varying with the same frequency and duty cycle as INA, and is generally synchronous to INA. Through C1 of the high pass filter, the output signal Y will have a time-varying component that also is synchronous to the input control signal INA.

The aforementioned high pass filter will not permit the DC component of INA to pass through to the output signal Y. Instead, the DC component of the output signal Y will be equal to the DC voltage of INA less the voltage drop across R1. The voltage drop across R1 is the resistance value of R1 multiplied by the current through R1. The current through R1 is I2 and is controlled by M2 and the bias voltage V1_BIAS provided to the gate of M2. Thus, the DC component of Y is INA−(R1)(I2). By selection of R1 and the current I2 through M2 (and thus through R1), the voltage drop across R1 can be set as desired. In one example, the voltage drop across R1 is 400 mv, which is significantly less than a Vbe (about 800 mv). As such, the control signal drive circuit of FIG. 1 is able to generate a suitable DC level for output signal Y while using a smaller supply voltage for VCC than would have been possible if a stacked BJT arrangement was used instead.

The generation of output signal Y_Z is similar to that described above. C2 is part of a high pass filter that includes the resistance of the downstream circuit as viewed from node 120, The signal on node 125 is time-varying with the same frequency and duty cycle as INA_Z, and is generally synchronous to INA_Z. Through C2 of the high pass filter, the output signal Y_Z will have a time-varying component that also is synchronous to the input control signal INA_Z and, through R2, have a DC component that is I5*R2 less than the DC component of INA_Z.

Figure 2:
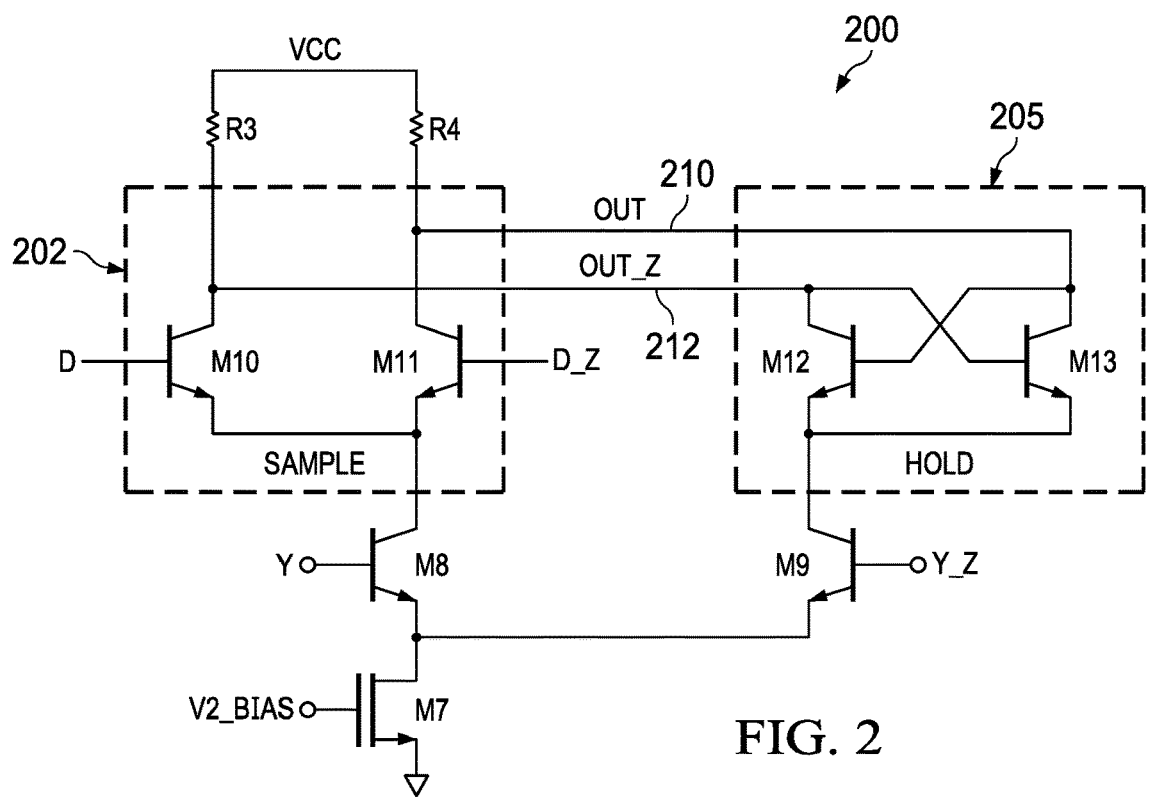
FIG. 2 illustrates a latch circuit usable with level-shifted output control signals from the control signal drive circuit of FIG. 1.

The control signal drive circuit 100 can be used to provide control signals Y and Y_Z for any of a variety of downstream CML functional circuits. FIG. 2 shows an example of a CML latch 200 implemented. The illustrative CML latch 200 includes a sample circuit 202 comprising transistors M10 and M11, a hold circuit comprising transistors M12 and M13, resistors R3 and R4, a current source transistor M7 and transistors M8 and M9. Transistors M10 and M11 receive a differential data D and D_Z. Transistors M8 and M9 receive the output signals Y and Y_Z, respectively, from FIG. 1. When Y is greater than Y_Z, current flows from VCC, through one or the other of M10 M11 depending on whether D is larger or smaller than D_Z through M8 and M7 to ground. M7 is biased using V2_BIAS to cause a fixed current level to flow from VCC to ground through the sample circuit 202, M8 and M7.

The output signals OUT and OUT_Z from the CML latch 200 are taken from nodes 210 and 212 as shown. When D is large enough to turn on M10, OUT_Z becomes VCC less the voltage drop across R3 (which his R3 times the current defined by current source device comprising M7). With D high, D_Z is low and thus M11 is off and thus OUT is high (i.e., higher than OUT_Z). OUT and OUT_Z are at the opposite voltage levels when D_Z is greater than D. With Y asserted high, OUT and OUT_Z track the input data signals D and D_Z in a transparent mode of operation of the latch. When Y_Z becomes high (and Y becomes low), current ceases to flow through the sample circuit 202 and, instead flows through the hold circuit 205 and through M9 and M7. The transistors M12 and M13 of the hold circuit are connected in a cross-coupled arrangement to operate in a regenerative positive feedback mode. As such, the output signals OUT and OUT_Z are held at their voltage levels on nodes 210 and 212 when Y_Z is high as no current will flow through the sample circuit 202 and the current instead flows through the hold circuit.

The Y and Y_Z signals operate the CML latch as described above and are generated by the control signal drive circuit 100 of FIG. 1. The power supply VCC used to operate the control signal drive circuit 100 of FIG. 1 and the CML latch 200 of FIG. 2 can be a smaller voltage level than would have been the case if a stacked arrangement of BJTs were used to generate the control signals Y and Y_Z for the CML latch. In one embodiment, VCC is greater than or equal to 1.5V (e.g., between 1.5V and 2.5V).

Figure 3:
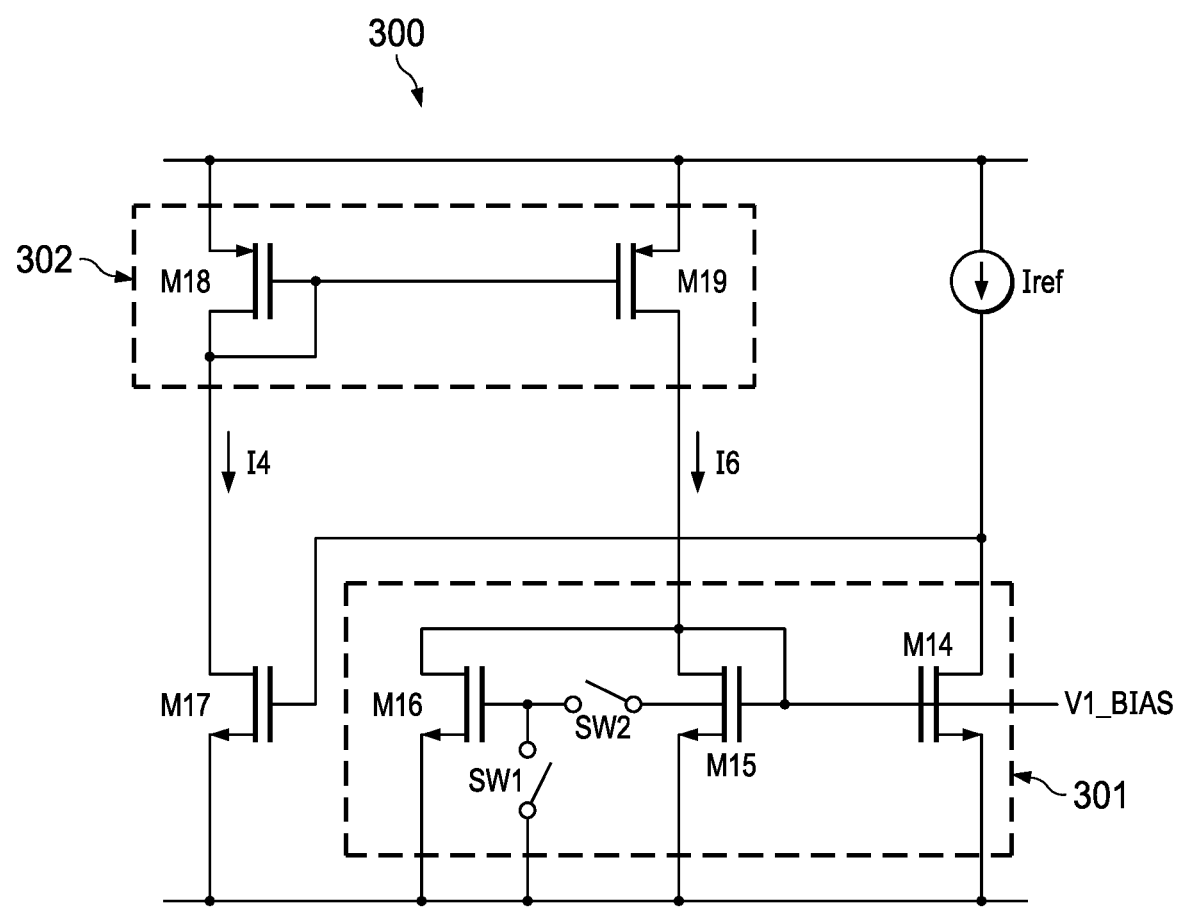
FIG. 3 illustrates a bias generation circuit to generate an adjustable bias voltage usable in the circuit of FIG. 1.

FIG. 3 shows an example of bias generation circuit 300 usable to generate the bias voltage shown as V1_BIAS in FIG. 1. V1_BIAS is generated in the example circuit of FIG. 3 to be an adjustable bias voltage. This circuit can operate at relatively low supply voltages, for example 1.5V, while offering a suitable drive impedance to the control signal drive circuit 100 of FIG. 1. Iref is applied to the drain of M14 and the voltage on the gate of M14 is set by negative feedback to the value required for the drain of M14 to source the current Iref. The negative feedback operation is achieved by transistors M14, M15, M16, M17, M18, and M19. Transistors M18 and M19 comprise a PMOS current mirror from 14 to 16 to reflect the drain current of M17 onto M15 and, if enabled by switch SW1 and SW2, M16. Transistors M14, M15, and M16 comprise another current mirror 301. M15 is always enabled in this example and provides a baseline current mirror ratio between M15 and M14 equivalent to [W(M14)/L(M14)]/[W(M14)/L(M15)], where W and L indicate transistor width and length. The gate of M16 is connected to VI_BIAS in order to adjust the overall current mirror ratio to [W(M14)/L(M14)]/[W(M15)/L(M15)+W (163)/L(M16)]. The gate of M17 is connected to the drain of M4 and to Iref. The voltage at the gate of M17 is set by negative feedback through current mirrors 301 and 302 to satisfy the current mirror ratios with Iref as the input to the circuit. Additional transistors can be added in addition to M15 and M16 in similar fashion to provide programmable current mirror ratios. Finally, V1_BIAS is connected to M2 and M5 of control signal drive circuit 100 in FIG. 1 to generate currents I2 and I5. These currents can be adjusted by the mirror ratio of current mirror 301.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Apparatus comprising:
a circuit, the circuit including: a first transistor and a second transistor, each having a respective control terminal and respective first and second terminals, the control terminal of the first transistor is coupled to a first input terminal, the first terminal of the first transistor is coupled to a first voltage terminal, the first terminal of the second transistor is coupled to a first output terminal;
a first resistor having a first resistor terminal directly connected to the first input terminal and having a second resistor terminal directly connected to the first output terminal;
a first capacitor having a first capacitor terminal coupled to the second terminal of the first transistor and having a second capacitor terminal coupled to the first output terminal;
a third transistor having a respective control terminal and respective first and second terminals, the first terminal of the third transistor is coupled to the second terminal of the first transistor and the second terminals of the second and third transistors are coupled to a second voltage terminal;
fourth and fifth transistors, each having a respective control terminal and respective first and second terminals, the control terminal of the fourth transistor is coupled to a second input terminal, the first terminal of the fourth transistor is coupled to the first voltage terminal, the first terminal of the fifth transistor is coupled to a second output terminal, and the control terminals of the second and fifth transistors are coupled together;
a second resistor having a third resistor terminal directly connected to the second input terminal and having a fourth resistor terminal directly connected to the second output terminal;
a second capacitor having a third capacitor terminal coupled to the second terminal of the fourth transistor and having a fourth capacitor terminal coupled to the second output terminal; and
a sixth transistor having a respective control terminal and respective first and second terminals, its first terminal is coupled to the second terminal of the fourth transistor, the control terminals of the third and sixth transistors are coupled together, and the second terminals of the fifth and sixth transistors are coupled to the second voltage terminal;
wherein the circuit is a first circuit, the apparatus further comprising a second circuit including:
a first current mirror including seventh and eighth transistors each having respective control terminals coupled together;
a second current mirror coupled to the first current mirror, the second current mirror including ninth and tenth transistors each having respective control terminals coupled together and coupled to the control terminals of the second and fifth transistors;
a current source coupled between the seventh and eighth transistors and one of the transistors of the second current mirror; and
an eleventh transistor coupled to the first current mirror, the eleventh transistor having a respective control terminal coupled to the current source and the one of the transistors of the second current mirror.

2. The apparatus of claim 1, wherein the first and fourth transistors are bipolar junction transistors (BJTs), and the second, third, fifth, and sixth transistors are metal-oxide semiconductor field-effect transistors (MOSFETs).

3. The apparatus of claim 1, wherein the second current mirror further including:
a twelfth transistor having a respective control terminal; and
a switch having a first switch terminal coupled to the control terminal of the twelfth transistor and a second switch terminal coupled to the control terminals of the ninth and tenth transistors.

4. The apparatus of claim 3, wherein the second circuit is configured to:
provide a first current mirror ratio for the second current mirror, which is based on length and width of the ninth and tenth transistors, when the switch is open, to generate a first current through the second transistor and a second current through the fifth transistor; and
provide a second current mirror ratio for the second current mirror, which is based on the length and width of the ninth and tenth transistors and length and width of the twelfth transistor, when the switch is closed, to change the first current through the second transistor and change the second current through the fifth transistor.

5. The apparatus of claim 3, wherein the seventh, eighth, ninth, tenth, eleventh, and twelfth transistors each having respective first and second terminals, and the current source having first and second current source terminals, and wherein:
the second terminals of the seventh and eighth transistors are coupled to the first current source terminal;
the control terminals of the seventh and eighth transistors are coupled to the first terminal of the seventh transistor and the first terminal of the eleventh transistor;
the first terminal of the eighth transistor is coupled to the first terminals of the ninth and twelfth transistors and to the control terminals of the ninth and tenth transistors;
the second current source terminal is coupled to the first terminal of the tenth transistor and the control terminal of the eleventh transistor; and
the second terminals of the ninth, tenth, eleventh, and twelfth transistors are coupled together.

6. Apparatus comprising:
a circuit, the circuit including: a first transistor and a second transistor, each having a respective control terminal and respective first and second terminals, the control terminal of the first transistor is coupled to a first input terminal, the first terminal of the first transistor is coupled to a first voltage terminal, the first terminal of the second transistor is coupled to a first output terminal;
a first resistor having a first resistor terminal directly connected to the first input terminal and having a second resistor terminal directly connected to the first output terminal;
a first capacitor having a first capacitor terminal coupled to the second terminal of the first transistor and having a second capacitor terminal coupled to the first output terminal;
a third transistor having a respective control terminal and respective first and second terminals, the first terminal of the third transistor is coupled to the second terminal of the first transistor and the second terminals of the second and third transistors are coupled to a second voltage terminal;
fourth and fifth transistors, each having a respective control terminal and respective first and second terminals, the control terminal of the fourth transistor is coupled to a second input terminal, the first terminal of the fourth transistor is coupled to the first voltage terminal, the first terminal of the fifth transistor is coupled to a second output terminal, and the control terminals of the second and fifth transistors are coupled together;
a second resistor having a third resistor terminal directly connected to the second input terminal and having a fourth resistor terminal directly connected to the second output terminal;
a second capacitor having a third capacitor terminal coupled to the second terminal of the fourth transistor and having a fourth capacitor terminal coupled to the second output terminal; and
a sixth transistor having a respective control terminal and respective first and second terminals, its first terminal is coupled to the second terminal of the fourth transistor, the control terminals of the third and sixth transistors are coupled together, and the second terminals of the fifth and sixth transistors are coupled to the second voltage terminal;
wherein the circuit is a first circuit, the apparatus further comprising a second circuit including:
a first pair of transistors;
a second pair of transistors cross-coupled to the first pair of transistors;
a first input transistor coupled to the first pair of transistors, the first input transistor having a respective control terminal coupled to the first output terminal;
a second input transistor coupled to the second pair of transistors, the second input transistor having a respective control terminal coupled to the second output terminal;
a current source transistor coupled to the first and second input transistors;
wherein the first pair of transistors, second pair of transistors, and first and second input transistors are bipolar junction transistors, and the current source transistor is a metal-oxide semiconductor field-effect transistor.

7. The apparatus of claim 6, wherein:
the first pair of transistors, each having a respective control terminal and respective first and second terminals, and the second terminals of the first pair of transistors are coupled together;
the second pair of transistors, each having a respective control terminal and respective first and second terminals, the first terminals of the transistors in the second pair are coupled to a different one of the first terminals of the transistors in the first pair, the second terminals of the second pair of transistors coupled together, and the gates of the second pair of transistors cross-coupled with the first terminals of the second pair of transistors;
the first input transistor having respective first and second terminals, the first terminal of the first input transistor is coupled to the second terminals of the first pair of transistors;
the second input transistor having respective first and second terminals, the first terminal of the second input transistor is coupled to the second terminals of the second pair of transistors, and the second terminals of the first and second input transistors are coupled together; and
the current source transistor having a respective first terminal coupled to the second terminals of the first and second input transistors and a respective second terminal coupled to the second voltage terminal.

* * * * *